United States Patent [19]

Vermeersch et al.

[11] Patent Number: 5,753,403
[45] Date of Patent: May 19, 1998

[54] DIAZO BASED IMAGING ELEMENT CONTAINING HYDROLYSED POLYVINYL ALCOHOL AND METAL-FREE PHTHALOCYANINE

[75] Inventors: Joan Vermeersch, Deinze; Dirk Kokkelenberg, St. Niklaas; Luc Vanmaele, Lochristi; Jan Gilleir, Mortsel, all of Belgium

[73] Assignee: Agfa-Gevaert, N.V., Mortsel, Belgium

[21] Appl. No.: 628,898

[22] Filed: Apr. 9, 1996

[30] Foreign Application Priority Data

Apr. 21, 1995 [EP] European Pat. Off. .............. 95201021

[51] Int. Cl.$^6$ .............................. G03F 7/021; G03F 7/30
[52] U.S. Cl. .................... 430/159; 430/157; 430/158; 430/160; 430/169; 430/302; 430/325
[58] Field of Search .................... 430/157, 158, 430/159, 160, 168, 169, 302, 325, 326

*Primary Examiner*—Christopher G. Young
*Attorney, Agent, or Firm*—Breiner & Breiner

[57] ABSTRACT

The present invention provides an imaging element comprising on a hydrophilic base a light-sensitive layer containing polyvinyl alcohol hydrolyzed to at least an extent of 95% by weight, a cationic surfactant and a diazo resin and/or a diazonium salt characterized in that the light-sensitive layer comprises metal-free phthalocyanine.

The present invention also provides a method for obtaining an imaging element as defined in any of the claims 1 to 6 by preparing a dispersion of metal-free phthalocyanine in water in the presence of a cationic surfactant in an amount ranging from 0.24 g/l to 24 g/l;

preparing a light-sensitive composition by mixing said dispersion, polyvinyl alcohol hydrolyzed to at least an extent of 95% by weight and a diazo resin and/or a diazonium salt and coating said light-sensitive composition on a hydrophilic base, characterized in that said dispersion comprises polyvinyl alcohol hydrolyzed to at least an extent of 95% by weight in an amount ranging from 4.0 g/l to 200 g/l.

9 Claims, No Drawings

DIAZO BASED IMAGING ELEMENT CONTAINING HYDROLYSED POLYVINYL ALCOHOL AND METAL-FREE PHTHALOCYANINE

DESCRIPTION

1. Field of the invention

The present invention relates to a diazo sensitized imaging element which is developable by plain water to a lithographic printing plate.

2. Background of the invention

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography, a photographic material is made imagewise receptive to oily or greasy inks in the photo-exposed (negative-working) or in the non-exposed areas (positive-working) on a hydrophilic background.

In the production of common lithographic printing plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers.

Particularly diazo-sensitized systems are widely used. These systems have been extensively reviewed by Kosar J. in "Light-Sensitive Systems", Wiley, New York, 1965, Chapter 7. A generally used negative-working diazo-sensitized system is based on the capability of diazo compounds to harden a polymer when exposed to ultraviolet and blue radiation. Diazo compounds which have been used for the preparation of lithographic printing plates based on their hardening properties are e.g. diazonium salts whose photolysis products can harden polymers (natural colloids or synthetic resins) directly and diazonium polymers. Although polymers containing diazonium groups have a large structure they remain water soluble owing to the presence of the ionic diazonium groups. When these groups are destroyed by exposure to light an insoluble resin is formed. Particularly useful diazonium polymers are the condensation products of a carbonyl compound, e.g. an aldehyde, such as formaldehyde, with a diazonium salt of e.g. a p-aminodiphenylamine. These condensation products are usually designated diazo resins. In these systems a polymeric binder is optionally added to the diazo resin coating.

Several types of supports can be used for the manufacturing of a diazo-sensitized lithographic printing plate. Common supports are metal supports like Al or Zn, polyester film supports and paper bases. These supports, if not sufficient hydrophilic by themselves, are first coated with a hydrophilic layer to form the hydrophilic background of the printing plate and a top layer containing the diazo compound is then applied (see for example DE-P-1900469, DE-P-2030634 and U.S. Pat. No. 3971660).

It is known to use as hydrophilic layer in these systems a layer containing polyvinyl alcohol and hydrolyzed tetraethyl orthosilicate and preferably also silicium dioxide and/or titanium dioxide as described in e.g. GB-P-1419512, FR-P-2300354, U.S. Pat. Nos. 3971660 and 4284705. This hydrophilic layer is overcoated with a light-sensitive layer containing a diazonium salt or a diazo resin in a polymeric binder. Preferably said polymeric binder is a polyvinyl alcohol hydrolyzed to at least an extent of 95% by weight as disclosed in EP-A 631189.

Upon image-wise exposure of the light-sensitive layer the exposed image areas become water insoluble and the unexposed areas remain water soluble. The plate is then developed with water to remove the diazonium salt or diazo resin in the unexposed areas. Such development may take place by means of plain water as disclosed in e.g. EP-A-450199 and EP-A-601240.

Usually, there is added a colored pigment to the light-sensitive layer in order to make clearly visible which part of the light-sensitive layer after exposure can not be removed by development and will become the ink accepting part and which part is removed by development and will become the non-printing part. This makes a visual inspection and possibly a correction of the printing plate possible before the printing is started. Hitherto, pigments were not suitable for said goal because their dispersion was not stable enough or caused coagulation of the light sensitive composition comprising said dispersion, polyvinyl alcohol hydrolyzed to at least an extent of 95% by weight and a light sensitive diazo compound and/or were ecologically worrying because they contained a heavy metal e.g. copper.

SUMMARY OF THE INVENTION

It is an object of the present invention to provide a diazo based imaging element comprising a colored pigment that is ecologically safe, can be brought in a stable dispersion, has a good milling capability and whereof the dispersion cause no coagulation of the light-sensitive composition comprising said dispersion, polyvinyl alcohol hydrolyzed to at least an extent of 95% by weight and a light-sensitive diazo compound.

It is a further object of the present invention to provide a method for preparing said diazo based imaging element.

Other objects will become apparent from the description hereinafter.

According to the present invention there is provided an imaging element comprising on a hydrophilic base a light-sensitive layer containing polyvinyl alcohol hydrolyzed to at least an extent of 95% by weight, a cationic surfactant and a diazo resin and/or a diazonium salt characterized in that the light-sensitive layer comprises metal-free phthalocyanine.

According to the present invention there is also provided a method for obtaining the above mentioned imaging element by preparing a dispersion of metal-free phthalocyanine in water in the presence of a cationic surfactant in an amount ranging from 0.24 g/l to 24 g/l;

preparing a light-sensitive composition by mixing said dispersion, polyvinyl alcohol hydrolyzed to at least an extent of 95% by weight and a diazo resin and/or a diazonium salt and coating said light-sensitive composition on a hydrophilic base, characterized in that said dispersion comprises polyvinyl alcohol hydrolyzed to at least an extent of 95% by weight in an amount ranging from 4.0 g/l to 200 g/l.

DETAILED DESCRIPTION

It has been found that a diazo based imaging element can be provided comprising a colored pigment that is ecologically safe, can be brought in a stable dispersion and whereof the dispersion cause no coagulation of the light-sensitive composition comprising said dispersion, polyvinyl alcohol hydrolyzed to at least an extent of 95% by weight and a light-sensitive diazo compound when said coloured pigment is metal-free phthalocyanine that is brought in dispersion in the presence of a cationic surfactant and polyvinyl alcohol hydrolyzed to at least an extent of 95% by weight.

The amount of metal-free phthalocyanine comprised in the light sensitive layer of the diazo based imaging element is not very important as long as it clearly colours the light-sensitive layer. For practical reasons the amount of metal-free phthalocyanine preferably ranges from 0.005 $g/m^2$ to 0.5 $g/m^2$, more preferably from 0.01 $g/m^2$ to 0.25 $g/m^2$, most preferably from 0.025 $g/m^2$ to 0.10 $g/m^2$ The preparation of the light-sensitive composition comprises mixing a dispersion of metal-free phthalocyanine, polyvinyl alcohol hydrolyzed to at least an extent of 95% by weight and a diazo resin and/or a diazonium salt. A dispersion of metal-free phthalocyanine may be obtained by the folowing steps.

In a first step a predispersion having particles with sizes in the range of 0.2 μm to 20 μm is obtained by stirring metal-free phthalocyanine, preferably in an amount ranging from 8 g/l to 300 g/l, more preferably from 30 g/l to 200 g/l in a solution of water or of water with an aqueous miscible silvent e.g. ethanol in the presence of a cationic surfactant in an amount ranging from 0.24 g/l to 24 g/l, more preferably from 0.80 g/l to 7.5 g/l and polyvinyl alcohol hydrolyzed to at least an extent of 95% by weight in an amount ranging from 4.0 g/l to 200 g/l, more preferably from 15 g/l to 120 g/l with a high shear mixer e.g. ULTRA TURRAX, KOTTHOFF MISCHSIRENE or DISSOLVER . The duration of said stirring is not so critical but should be long enough to get an homogenuous predispersion. In practice a duration ranging from 120 s to 1800 s, more preferably from 360 s to 1200 s is applied. The temperature of the stirring is not critical but is for practical reasons preferably comprised between 15° C. and 50° C., more preferably between 20° C. and 35° C.

In a second step said predispersion is milled till a submicrometer dispersion is obtained. Suitable mills are e.g. horizontal pearl mills f.i. DYNOMILL and COBALL-MILL, ball mills, sand mills , vertical mills etc. The temperature of the milling is not critical but is for practical reasons preferably comprised between 15° C. and 50° C., more preferably between 20° C. and 35° C. The duration of the milling is determined by the technical features of the mill but are obvious for one skilled in the art. In practice said duration may range from 120 s to 3600 s, preferably from 300 s to 2400 s.

Cationic surfactants according to the invention may be alkylamine salts, aliphatic, aromatic, or heterocyclic quaternary ammonium salts, aliphatic or heterocyclic ring-containing phosphonium or sulphonium salts. Preferably quaternary ammonium salts comprising at least one $C_{10}$–$C_{20}$ alkyl group are used.

Preferably the polyvinyl alcohol in the dispersion is a polyvinyl acetate hydrolyzed to an amount of 97% to 100% by weight. The number average weight of the polyvinyl alcohol hydrolyzed to at least an extent of 95% by weight is not critical.

The light-sensitive composition is obtained by mixing said dispersion, polyvinyl alcohol hydrolyzed to at least an extent of 95% by weight and a diazo resin and/or a diazonium salt. The order of addition is not critical but preferably said dispersion is added to a composition comprising already said polyvinyl alcohol.

Preferably said polyvinyl alcohol comprised as the binder in the light-sensitive layer of the diazo based imaging element is a polyvinyl acetate hydrolyzed to an amount of 97% to 100% by weight. The number average weight of the polyvinyl alcohol hydrolyzed to at least an extent of 95% by weight is preferably at least 35000 g/mole and more preferably at least 50000 g/mole.

The amount of said polyvinyl alcohol ranges preferably from 0.02 $g/m^2$ to 2 $g/m^2$, more preferably from 0.1 $g/m^2$ to 0.5 $g/m^2$.

The amount of the diazonium salt or diazo resin comprised in the light sensitive layer of the diazo based imaging element ranges preferably from 0.04 $g/m^2$ to 3 $g/m^2$, more preferably from 0.15 $g/m^2$ to 1.0 $g/m^2$.

Examples of low-molecular weight diazonium salt for use in the present invention include: benzidine tetrazoniumchloride, 3,3'-dimethylbenzidine tetrazoniumchloride, 3,3'-dimethoxybenzidine tetrazoniumchloride, 4,4'-diaminodiphenylamine tetrazoniumchloride, 3,3'-diethylbenzidine tetrazoniumsulfate, 4-aminodiphenylamine diazoniumsulfate, 4-aminodiphenylamine diazoniumchloride, 4-piperidino aniline diazoniumsulfate, 4-diethylamino aniline diazoniumsulfate and oligomeric condensation products of diazodiphenylamine and formaldehyde.

Examples of diazo resins useful in the present invention include condensation products of an aromatic diazonium salt as the light-sensitive substance. Such condensation products are known and are described, for example, in German Pat. no. 1214086. They are in general prepared by condensation of a polynuclear aromatic diazonium compound, preferably of substituted or unsubstituted diphenylamine-4-diazonium salts, with active carbonyl compounds, preferably formaldehyde, in a strongly acid medium.

The light sensitive layer according to the present invention preferably also contains dispersed water-insoluble polymers in an amount ranging from 0.05 $g/m^2$ to 5 $g/m^2$, more preferably from 0.15 $g/m^2$ to 1.5 $g/m^2$. Said aqueous dispersion of water insoluble polymer is preferably cationic or nonionic either e.g. as a result of an emulsifier or by having the cationic or nonionic group linked to the polymer. The water insoluble polymer is preferably a solid particulate having a size in the range of about 100 Angstroms to 1 micron in diameter and does not form a film below 30 ° C. In general, any polymer which carries a cationic or nonionic group or which can be formulated into an emulsion using a cationic or nonionic emulsifier can be employed in the present invention. Suitable polymers include homopolymers and copolymers of styrene, methylacrylate, ethylacrylate, butylacrylate, methylmethacrylate, ethylmethacrylate, butyl methacrylate, vinyl acetate, vinyl chloride, vinylidene chloride, butadiene, methyl styrene, vinyl toluene, dimethylaminoethyl acrylate, acrylic acid, methacrylic acid, isoprene, chloroprene, malei anhydride, ethylene glycol acrylates such as polyethylene glycol acrylate, halogenated vinyl aromatics such as chlorostyrene and bromostyrene, methylvinyl ether, vinyl pyrrolidone, polyurethane and the like.

Among the cationic and nonionic emulsifiers which can be used in the present invention are: ammonium salts of substituted amines containing alkyl and/or aryl groups attached to the nitrogen, alkyl or aryl sulfonium salts, alkyl and alkyl-aryl polyethers, cationic or nonionic fluorosurfactants and polyoles.

Preferably the light sensitive layer further includes a cationic fluor containing surfactant, preferably a perfluorinated surfactant and more preferably a perfluorinated ammonium surfactant. Typical examples of perfluorinated ammonium surfactants are:

n.$C_8F_{17}SO_2NH$—$(CH_2)_3N^+(CH_3)_3I^-$ (Fluorad FC 135 from 3M)

n.$C_9F_{19}SO_2NH$—$(CH_2)_4N^+(CH_3)_3Br^-$ n.$C_7F_{15}CONH$—$(CH_2)_3N^+(CH_3)_3I^-$ (n.$C_8F_{17}COO$—$(CH_2)_4)_2N^+(CH_3)_2I^-$

The cationic fluor containing surfactant is preferably used in amount of 3 mg/m$^2$ to 100 mg/m$^2$ more preferably between 5 mg/m$^2$ to 55 mg/m$^2$.

The thickness of the light-sensitive layer in the material of this invention may vary in the range from 0.1 to 10 μm and is preferably between 0.5 and 2.5 μm.

Hydrophilic bases for use in connection with the present invention are supports having a hydrophilic surface e.g. a roughened and anodized aluminium support or supports that are rendered hydrophilic by means of a hydrophilic layer provided on at least one surface of the support.

Supports that can be provided with a hydrophilic layer are e.g. photographic film bases e.g. substrated polyethylene terephthalate film, cellulose acetate film, plastics having a metal layer or deposit thereon, a metal support, e.g. aluminium and polyolefin (e.g. polyethylene) coated paper, the polyolefin surface of which may have been subjected to a corona discharge to improve the adherence of a hydrophilic layer.

As hydrophilic (co)polymers in said hydrophilic layer one may use, for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is the same as or higher than the hydrophilicity of polyvinyl acetate hydrolyzed to at least an extent of 60 percent by weight, preferably 80 percent by weight.

Said hydrophilic layer is preferably hardened with a hydrolyzed tetraalkyl orthosilicate crosslinking agent e.g. hydrolyzed tetraethyl orthosilicate or hydrolyzed tetramethyl orthosilicate.

The amount of tetraalkyl orthosilicate crosslinking agent is preferably at least 0.2 parts by weight per part by weight of hydrophilic (co)polymer, more preferably between 0.5 and 5 parts by weight, most preferably between 1.0 parts by weight and 3 parts by weight.

Said hydrophilic layer preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the layer is given a uniform rough texture consisting of microscopic hills and valleys, which serve as storage places for water in background areas.

The thickness of the hydrophilic layer may vary in the range of 0.2 to 25 um and is preferably 1 to 10 um.

One or more subbing layers may be coated between the support and the hydrophilic layer for use in accordance with the present invention in order to get an improved adhesion between these two layers.

A preferred subbing layer for use in connection with the present invention is a subbing layer comprising a hydrophilic binder and silica.

As hydrophilic binder in said subbing layer usually a protein, preferably gelatin may be used. Gelatin can, however, be replaced in part or integrally by synthetic, semi-synthetic, or natural polymers. Synthetic substitutes for gelatin are e.g. polyvinyl alcohol, poly-N-vinyl pyrrolidone, polyvinyl imidazole, polyvinyl pyrazole, polyacrylamide, polyacrylic acid, and derivatives thereof, in particular copolymers thereof. Natural substitutes for gelatin are e.g. other proteins such as zein, albumin and casein, cellulose, saccharides, starch, and alginates. In general, the semi-synthetic substitutes for gelatin are modified natural products e.g. gelatin derivatives obtained by conversion of gelatin with alkylating or acylating agents or by grafting of polymerizable monomers on gelatin, and cellulose derivatives such as hydroxyalkyl cellulose, carboxymethyl cellulose, phthaloyl cellulose, and cellulose sulphates.

A preferred silica in said subbing layer is a siliciumdioxide of the anionic type. The colloidal silica preferably has a surface area of at least 100 m2 per gram, more preferably a surface area of at least 300 m$^2$ per gram. The surface area of the colloidal silica is determined according to the BET-value method described by S. Brunauer, P. H. Emmett and E. Teller. J.Amer. Chem. Soc. 60, 309–312 (1938).

The silica dispersion may also contains other substances, e.g. aluminium salts, stabilising agents,biocides etc.

Such types of silica are sold under the name KIESELSOL 100, KIESELSOL 300 and KIESELSOL 500 (KIESELSOL is a registered trade name of Farbenfabriken Bayer AG, Leverkusen, West-Germany whereby the number indicates the surface area in m$^2$ per gram).

The weight ratio of the hydrophilic binder to silica in the subbing layer is preferably less than 1. The lower limit is not very important but is preferably at least 0.2. The weight ratio of the hydrophilic binder to silica is more preferably between 0.25 and 0.5.

The coverage of said subbing layer is preferably more than 200 mg per m$^2$ but less than 750 mg per m$^2$, more preferably between 250 mg per m$^2$ and 500 mg per m$^2$.

The coating of the above defined subbing layer composition preferably proceeds from an aqueous colloidal dispersion optionally in the presence of a surface-active agent.

In accordance with a preferred embodiment there is provided an intermediate layer of an organic compound having cationic groups between the hydrophilic surface of the support and light sensitive layer. As a consequence the development by plain water of such a diazo based imaging element is improved.

Organic compounds having cationic groups for use in the intermediate layer are preferably hydrophilic and may be low moleculair weight compounds but are preferably polymers. Preferred compounds are those having one or more ammonium groups or amino groups that can be converted to ammonium groups in an acidic medium. An especially preferred type of cationic compounds are polysacharides modified with one or more groups containing an ammonium or amino group.

Most preferred organic compounds having cationic groups are dextrans or pullulan wherein at least some of the hydroxy groups of the dextran or pullulan has been modified into one or more of the following groups:

—O—R$^1$
—O—CO—R$^2$ wherein R$^1$ represents an organic residue containing an amino or ammonium group, e.g. an amine substituted alkyl, an amine substituted alkylaryl etc.. R$^2$ has one of the significances given for R$^1$ or stands for —OR$^3$ or —N(R$^4$)R$^5$, wherein R$^3$ has one of the significances given for R$^1$ and each of R$^4$ and R$^5$ which may be the same or different and have one of the significances given for R$^1$.

Pullulan is a polysacharide that is produced by microorganisms of the Aureobasidium pullulans type (Pullularia pullulans) and that contains maltotriose repeating units connected by a α-1,6 glycosidic bond. Pullulan is generally produced on industrial scale by fermentation of partially hydrolysed starch or by bacterial fermentation of sucrose. Pullulan is commmercially available from e.g. Shodex, Pharmacosmos.

Examples of dextrans or pullulan that can be used in accordance with the present invention are dextrans or pullulan wherein some of the hydroxyl groups have been modified in one of the groups shown in table 1.

TABLE 1

| no. | modified group |
|---|---|
| 1 | —O—CH$_2$—CH$_2$—NH$_2$ |
| 2 | —O—CO—NH—CH$_2$—CH$_2$—NH$_2$ |
| 3 | —O—CO—NH—CH$_2$—CH$_2$—N(CH$_2$—CH$_2$—NH$_2$)$_2$ |
| 4 | —O—CH$_2$—CH$_2$—NH—CH$_2$—CH$_2$—NH$_2$ |
| 5 | —O—CH$_2$—CH$_2$—NH—CH$_2$—CHOH—CH$_2$—N$^+$(CH$_3$)$_3$ Cl$^-$ |
| 6 | —O—(CH$_2$—CH$_2$—O)$_n$—CH$_2$—CH$_2$—NH$_2$ wherein n represents an integer from 1 to 50 |
| 7 | —O—CO—NH—CH$_2$—CH$_2$—NH—CH$_2$—CHOH—CH$_2$—N$^+$(CH$_3$)$_3$ Cl$^-$ |
| 8 | —O—CH$_2$—CH$_2$—N(CH$_2$—CH$_3$)$_2$.HCl |
| 9 | —O—CH$_2$—CH$_2$—N(CH$_2$—CH$_2$—NH$_2$)$_2$ |
| 10 | —O—CONH—CH$_2$—CH$_2$—N(CH$_2$—CH$_2$—NH$_2$)$_2$ |
| 11 | —O—CONH—(CH$_2$—CH$_2$—O)$_n$—CH$_2$—CH$_2$—NH$_2$ |

The modified dextrans or pullulan can be prepared by a reaction with e.g. alkylating agents, chloroformates, acid halides, carboxylic acids etc . . .

The intermediate layer containing the organic compound having one or more cationic groups is preferably provided in an amount of 5 to 500 mg/m$^2$ and more preferably in an amount of 10 to 200 mg/m$^2$.

To obtain a lithographic printing plate from an imaging element according to the invention said imaging element is image-wise exposed and subsequently rinsed or washed preferably with plain water to remove diazo resin or diazonium salts in the non-exposed or insufficiently exposed parts of the imaging element.

The exposure of the imaging element used in the present invention advantageously proceeds with ultraviolet light optionally in combination with blue light in the wavelength range of 250 to 500 nm. Useful exposure sources are high or medium pressure halogen mercury vapour lamps, e.g. of 1000 W. Since most lithography is done by the offset process, the imaging element is preferably exposed in such a way that the image obtained thereon is right reading. The exposure may be an exposure using optics or a contact exposure.

The diazo resin or diazonium salts are converted upon exposure from water soluble to water insoluble (due to the destruction of the diazonium groups) and additionally the photolysis products of the diazo may induce an advancement in the level of crosslinking of the polymeric binder or diazo resin, thereby selectively converting the surface, in an image pattern, from water soluble to water insoluble. The unexposed areas remain unchanged, i.e. water soluble.

The following examples illustrate the present invention without being limited thereto. The percentages given are by weight unless otherwise stated.

EXAMPLE 1

Preparation of the dispersion of metal-free phthalocyanine.

To 400 ml of water were added under stirring 80 g of metal-free phthalocyanine and 2.4 g of cetyltrimethyl ammonium bromide and the obtained mixture stirred for 300 s more with a high shear mixer KOTTHOFF MISCHSIRENE at 720 rpm. To this mixture was added a solution of 40 g of polyvinyl alcohol of various molecular weight and various degree of hydrolysis (see table 1) in 400 ml of water and this mixture was further stirred as described above for 300 s more. Finally there was added 200 ml more of water under stirring to obtain the predispersions 1 to 7.

Said predispersions were then milled by 6 passages in a DYNOMILL KDL 0.6 1 with ZrO$_2$ pearls of 1–1.6 mm and a perimeter speed of 16 m/s at a flow rate of 1.6 ml/s to yield the dispersion Disp 1 to Disp 7.

The obtained dispersions were evaluated after a standing time of 48 hours on stability (eval 1). A drop of the appropriate dispersion is viewed under a light microscope. The number of agglomerates (particles greater than 1 μm) is evaluated. A suitable, stable dispersion has a low number of such particles. The results are given in table 1. All the dispersions Disp 1 to Disp 7 gave a good result in this evaluation.

A dispersion Disp 8 was prepared similar to Disp 5 but by substituting ANTAROX CO 630 (a non-ionic surfactant of GAF, USA) for cetyltrimethyl ammonium bromide. Disp 8 gave a very bad result in this test.

Preparation of light-sensitive compositions LSC 1 to LSC 7.

To 63g of a 20% dispersion of polymethylmethacrylate (particle diameter of 40 nm) stabilized with cetyltrimethylammoniumbromide in deionized water was subsequently added, while stirring, 120 g of a 5% solution of a 98% hydrolized polyvinylacetate, having a number average molecular weight of 90 000 g/mol (POLYVIOL W48/20 available from Wacker), in water and 20 g of a 8% dispersion Disp 1. 66 g of a 15% solution of the condensationproduct of diphenylamine diazonium salt and formaldehyde in water was then slowly added. Finally 30 g of a 1.6% solution of cationic fluor containing surfactant (Fluorad FC 135 available from 3M) in water, and 726 ml of water were added to yield LSC 1.

LSC 2 to LSC 7 were obtained in a similar way but by substituting the appropriate dispersion Disp 2 to Disp 7 for Disp 1.

These light-sensitive compositions were left standing for 24 hours and then evaluated as described above. The results are given in table 1. It is clear that only the dispersions Disp 5 to Disp 7 which were the only dispersions prepared with polyvinyl alcohol with a hydrolysis degree of ~97% by weight gave stable light-sensitive compositions

TABLE 1

| Disp. | PVA[a] | Visc.[b] | Hydro.[c]% | Eval. 1[d] | Eval. 2[e] |
|---|---|---|---|---|---|
| 1 | POLYVIOL G40/140 | 40 | 86–89 | + | – |
| 2 | MOWIOL 18/88 | 18 | 87,7 | + | – |
| 3 | POLYVIOL M05/140 | 4.5 | 86–89 | + | – |
| 4 | POLYVIOL V03/240 | 3 | 75–79 | + | – |
| 5 | POLYVIOL W28/20 | 28 | 97–99 | + | + |
| 6 | POLYVIOL M05/20 | 5 | 97–99 | + | + |
| 7 | MOWIOL M56/98 | 56 | 98,5 | + | + |

[a]) PVA: polyvinyl alcohol from WACKER (POLYVIOL) or HOECHST (MOWIOL)
[b]) Visc.: viscosity of a 4% solution in water at 20° C. in mPa.s
[c]) Hydro.: Hydrolysis degree in weight percent
[d]) Eval. 1: stability of the dispersions after conservation for 48 h: + = stable; – = unstable
[e]) Eval. 2: stability of the coating solution 24 h after addition of the dispersion: + = stable; – = unstable

EXAMPLE 2

Preparation of a lithographic base

To 440 g of a dispersion contg. 21.5% $TiO_2$ (average particle size 0.3 to 0.5 um) and 2.5% polyvinyl alcohol in deionized water were subsequently added, while stirring, 250 g of a 5% polyvinyl alcohol solution in water, 105 g of a hydrolyzed 22% tetramethylorthosilicate emulsion in water and 12 g of a 10% solution of a wetting agent. To this mixture was added 193 g of deionized water and the pH was adjusted to pH-4.

The obtained dispersion was coated on a polyethyleneterephthalate film support having a thickness of 275 μm (382 g/m$^2$) (coated with a hydrophilic adhesion layer) to a wet coating thickness of 50 g/m$^2$, dried at 30° C. and subsequently hardened by subjecting it to a temperature of 57° C. for 1 week.

To this base was further provided an aqueous solution (pH=5) of Dormacid (a dextran modified with a diethylaminoethylgroup available from Pfeifer & Langen) and a cationic wetting agent to a dry coating thickness of 30 mg Dormacid per m$^2$.

The obtained element was then heated for 1 week at 57° C.

Preparation of the imaging element

The imaging element was produced by coating the above described light sensitive composition LSC 5 to the above described lithographic base in an amount of 35g/m$^2$ (wet coating amount) and drying it at 30° C.

The obtained imaging element was stored for 48 hours at 57° C.

The imaging element was exposed to a high pressure halogen mercury vapour lamp of 1000 W at a distance of 70 cm for 90 seconds.

Subsequently the imaging element was developed by rinsing with plain water, giving a very clear difference in color between the removed (the non-printing) areas and the remaining (the printing) areas. Said plate was used to print on an offset press running with a commonly employed ink and fountain solution.

It was found that the printing plate obtained with the above described imaging element according to the invention could be used to print 10.00 copies of excellent quality.

We claim:

1. An imaging element comprising on a hydrophilic base a light-sensitive layer containing polyvinyl alcohol hydrolysed to at least an extent of 95% by weight in an amount between 0.02 g/m$^2$ and 2 g/m$^2$, a cationic surfactant in an amount between 3 mg/m$^2$ and 100 mg/m$^2$ and a diazo resin and/or a diazonium salt in an amount between 0.04 g/m$^2$ and 3 g/m$^2$, wherein the light-sensitive layer comprises metalfree phthalocyanine in an amount between 0.005 g/m$^2$ and 0.5 g/m$^2$.

2. An imaging element according to claim 1 wherein said hydrophilic base comprises a support provided with a hydrophilic layer containing a hydrophilic (co)polymer or (co) polymer mixture and having been hardened with a hydrolysed tetraalkyl orthosilicate crosslinking agent.

3. An imaging element according to claim 1 wherein said light sensitive layer contains a polyvinylacetate hydrolysed to an extent of at least 97% by weight as a hydrophilic binder and further a cationic fluor containing surfactant.

4. An imaging element according to claim 1 wherein a subbing layer comprising a hydrophilic binder and silica is coated between the support and the hydrophilic layer.

5. An imaging element according to claim 1 wherein there is provided an intermediate layer containing an organic compound having cationic groups between said hydrophilic layer and said light sensitive layer.

6. A method for obtaining an imaging element as defined in claim 1 by preparing a dispersion of metal-free phthalocyanine in water in the presence of a cationic surfactant in an amount ranging from 0.24 g/l to 24 g/l;

preparing a light-sensitive composition by mixing said dispersion, polyvinyl alcohol hydrolyzed to at least an extent of 95% by weight and a diazo resin and/or a diazonium salt and coating said light-sensitive composition on a hydrophilic base, characterized in that said dispersion comprises polyvinyl alcohol hydrolyzed to at least an extent of 95% by weight in an amount ranging from 4.0 g/l to 200 g/l.

7. A method for obtaining an imaging element according to claim 6 wherein said cationic surfactant is an aliphatic quaternary ammonium salt.

8. A method for obtaining an imaging element according to claim 6 wherein said dispersion is obtained by first preparing a predispersion by stirring metal-free phthalocyanine in a solution of water or of water with an aqueous miscible solvent in the presence of a cationic surfactant in an amount ranging from 0.24 g/l to 24 g/l and polyvinyl alcohol hydrolyzed to at least an extent of 95% by weight in an amount ranging from 4.0 g/l to 200 g/l and then milling said predispersion to a dispersion.

9. A method for making a lithographic printing plate comprising the steps of image-wise exposing an imaging element as defined in claim 1 and subsequently developing a thus obtained image-wise exposed imaging element by means of rinsing with an aqueous liquid to remove diazo resin and/or diazonium salts in the non-exposed or insufficiently exposed parts of the imaging element.

* * * * *